United States Patent [19]
Rees

[11] Patent Number: 5,841,687
[45] Date of Patent: Nov. 24, 1998

[54] INTERDIGITATED MEMORY ARRAY

[75] Inventor: David B. Rees, Overton Hants, United Kingdom

[73] Assignee: Cypress Semiconductor Corporation, San Jose, Calif.

[21] Appl. No.: 800,622

[22] Filed: Feb. 14, 1997

Related U.S. Application Data

[63] Continuation of Ser. No. 590,926, Jan. 24, 1996, abandoned.

[51] Int. Cl.$^6$ ....................................................... G21C 5/06
[52] U.S. Cl. .................. 365/63; 365/230.04; 365/230.06
[58] Field of Search .......................... 365/63, 72, 189.01, 365/230.01, 230.04, 230.06, 189.04, 230.25

[56] References Cited

U.S. PATENT DOCUMENTS

| | | | |
|---|---|---|---|
| 4,982,372 | 1/1991 | Matsuo | 365/230.03 |
| 5,036,491 | 7/1991 | Yamaguchi | 365/189.07 |
| 5,060,200 | 10/1991 | Miura et al. | 365/230.05 |
| 5,555,529 | 9/1996 | Hose, Jr. et al. | 365/230.04 |

*Primary Examiner*—Tan T. Nguyen
*Attorney, Agent, or Firm*—Maiorana & Acosta, P.C.

[57] ABSTRACT

A method and apparatus to eliminate the problem of requiring sizing of the row and column decoders according to the pitch of the cells in the memory array is to decouple the decoder cell pitch from the memory cell pitch without causing the chip area to increase dramatically. Decoupling is accomplished by driving the array from both sides for row drivers and by driving the array from both the top and bottom for column drivers. This is achieved in one embodiment by driving alternating rows from opposite sides for row decoders. Even numbered rows are driven from one side and odd numbered rows are driven from the other side. Alternating columns are driven from both the top and bottom. For example, odd numbered columns are driven from the top while even numbered columns are driven from the bottom. In a second embodiment, predetermined rows are driven from one side while the others are driven from the other side. Similarly, predetermined columns may be driven from the top while the others are driven from the bottom. Rows 1 and 2 are driven from one side, rows 3 and 4 from the other, etc. Also, rows 1~3 may be driven from one side and rows 4~6 from the other. Columns 1 and 2 may be driven from the top, 3 and 4 from the bottom, 5 and 6 from the top, etc. Again, columns 1~3 may be driven from the top and columns 4~6 driven from the bottom.

27 Claims, 2 Drawing Sheets

INTERDIGITATED MEMORY ARRAY

This is a continuation of application Ser. No. 08/590,926 filed on Jan. 24, 1996, abandoned.

BACKGROUND OF THE INVENTION

1. Field of the Invention

The present invention pertains to memory cell arrays with row and column decoders or drivers and more particularly to a row and column decoder architecture for simplifying decoder layout.

2. Related Prior Art

Conventional design for a memory array in a chip has a two dimensional array of memory cells and a two dimensional arrangement for row and column drivers. FIG. 1 is an illustration of a layout of a conventional design for a memory array for a one page memory. Typically, as illustrated, row driver/decoders 12 are physically placed along one or the other side of the memory cell array 14. Column drivers or decoders or selectors 16 are physically placed along the top of memory cell array 14 in some architectures and along the bottom in other architectures. This arrangement or architecture is structurally simple but presents problems in implementation.

FIG. 2 illustrates a two page memory array where row drivers 18 and 20 are placed on either sides of memory arrays 22 and 24, respectively. Column drivers 26 and 28 are physically placed along the bottom of memory cell arrays 22 and 24 in this illustration. The actual memory cell arrays may contain all of the memory cells on this single chip or only some fraction of the total number on the chip. For example, only a fraction of the total number of memory cells may be contained in a memory cell array that contains two pages, such as illustrated in FIG. 2, where the illustration represents part of a much larger chip with many pages.

The problem with this scheme is that both the row and column decoders have to be sized so that they have the same pitch as the cells in the memory array. Although process scaling usually works for both memory and pitched cells, for some architectures it is very difficult to maintain the memory cell pitch for the decoder or driver. This is true especially if the decoder or driver contains large transistors because the driven load is large, or where the memory cell contains very few transistors and is so very small.

FIG. 3 is a layout diagram of a typical memory cell array illustrating a row driver 30 and associated memory cells 32. Only a small part of the total row driver and memory cell array is illustrated for convenience and simplicity in explanation. In FIG. 3 each row driver cell is the same height as six memory cells. R1 driver is connected to the memory cells in M ROW 1, R2 is the driver connected to the memory cells in M ROW 2, R3 driver is connected to the memory cells in M ROW 3, R4 is the driver connected to the memory cells in M ROW 4, R5 driver is connected to the memory cells in M ROW 5 and R6 is the driver connected to the memory cells in M ROW 6. R1 driver has to drive across R2–R6 to reach M ROW 1 even though it has no electrical connections in R2–R6. Similarly, R2 has to drive across R3–R6 to reach M ROW 2 even though it has no electrical connections in R3–R6. Accordingly, R3 has to drive across R4–R6, R4 has to drive across R5–R6 and R5 has to drive across R6, even though none have electrical connections in the drivers they drive across. There is wasted chip area because of the space taken up routing the signals from the row driver across each other.

SUMMARY OF THE INVENTION

The present invention provides a method and apparatus for permitting row and column access in a memory array from row and column decoders that are not required to be sized exactly to the pitch of the cells in the memory array. Driving the memory cell array from both sides is a simple way to simplify this scheme and to make it more area efficient.

The solution to the problem of requiring sizing of the row and column decoders according to the pitch of the cells in the memory array is to decouple the decoder cell pitch from the memory cell pitch without causing the chip area to increase dramatically. The present invention accomplishes the decoupling by driving the array from both sides. This is achieved in the present invention by driving a portion, preferably half, of the rows from opposite sides for row decoders. In the preferred embodiment, even numbered rows are driven from one side and odd numbered rows are driven from the other side. Also in the preferred embodiment of the present invention alternating columns are driven from both the top and bottom. For example, odd numbered columns are driven from the top while even numbered columns are driven from the bottom. However, in alternate arrangements consecutive rows or columns may be driven from alternating sides. For example, row 1 and 2 or column 1 and 2 may be driven from one side or the top while row 3 and 4 or columns 3 and 4 may be driven from the other side or the bottom. The method and apparatus of the present invention is particularly useful for memory arrays where the cells are very small. For example, EPROMs have very small cells in the to memory arrays. In some applications, it may be beneficial to use this technique only for the rows or only for the columns.

DESCRIPTION OF THE PREFERRED EMBODIMENT

Figure 1:
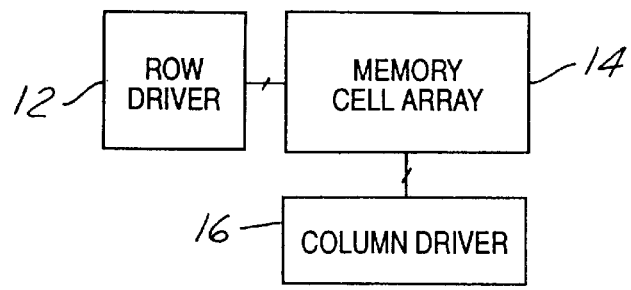
FIG. 1 illustrates a layout of a conventional design for a memory array for a one page memory.
Figure 2:
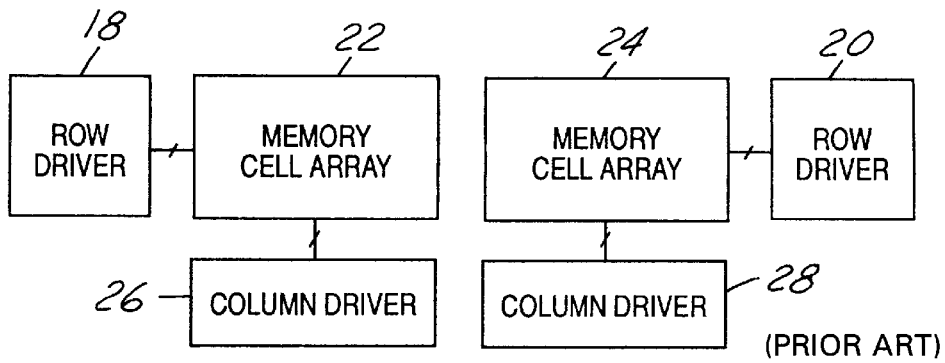
FIG. 2 illustrates a layout of a conventional design for a memory array for a two page memory.
Figure 3:
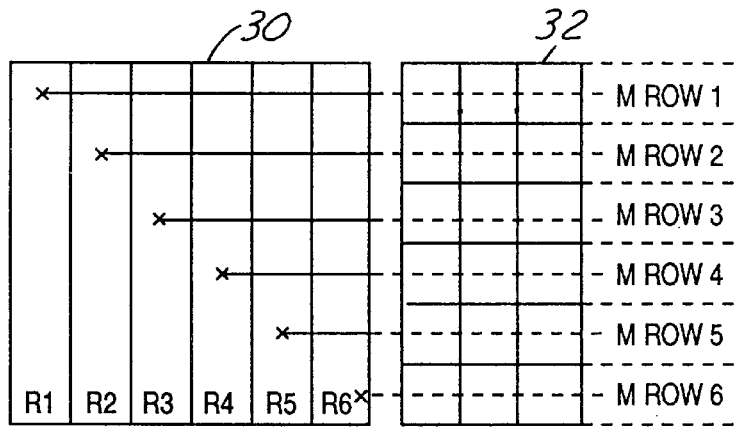
FIG. 3 is a layout diagram of a typical memory array illustrating a row driver and associated memory cells.

As stated previously, conventional design for a memory array in a chip has a two dimensional array of memory cells. As illustrated in FIGS. 1 and 2, row driver/decoders are physically placed along one or the other side of the memory cell array. Column drivers or decoders or selectors are physically placed along the top of memory cell array in some situations and along the bottom in other situations.

The problem with this scheme is that both the row and column decoders have to be sized so that they have the same pitch as the cells in the memory array. Process scaling usually works for both memory and pitched cells, but for some architectures, it is very difficult to maintain the memory cell pitch for the decoder or driver. This is true especially if the decoder or driver contains large transistors because the driven load is large or when the memory cell contains very few transistors and so is very small .

In addition, a driver has to drive across all drivers between it and the memory cell array, even though it has no electrical connections to the drivers it drives across. There is wasted chip area because of the space taken up routing the signals from the row driver across the other drivers.

The present invention provides a solution to the problem of requiring sizing of the row and column decoders exactly to the pitch of the cells in the memory array. The solution provided by the present invention is to decouple the decoder cell pitch from the memory cell pitch. This is done by the present invention without causing the chip area to increase dramatically.

The present invention accomplishes the decoupling by driving the array from both sides and top and bottom instead of the conventional one sided or only top or bottom array driving. Decoupling is accomplished by driving the array from both sides for row drivers and by driving the array from both the top and bottom for column drivers. This is achieved by driving alternating rows from opposite sides for row decoders. Even numbered rows are driven from one side and odd numbered rows are driven from the other side. Alternating columns are driven from both the top and bottom. For example, odd numbered columns are driven from the top while even numbered columns are driven from the bottom. Or, in the alternative, as stated previously, consecutive rows or columns may be driven from alternating sides.

Figure 4:
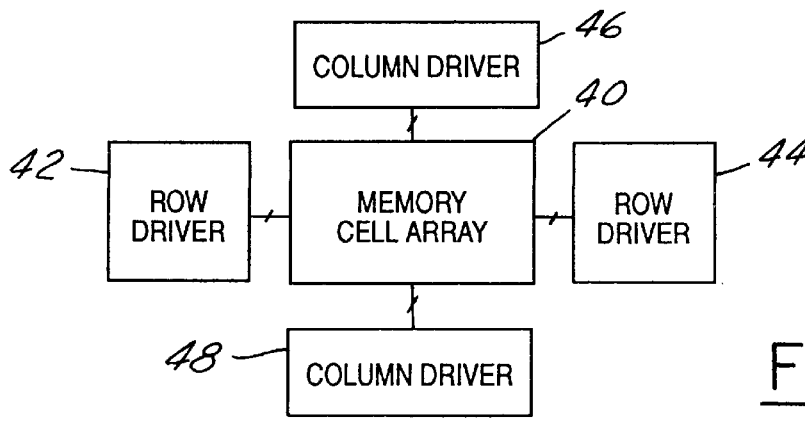
FIG. 4 is an illustration of the architecture for an interdigitated memory array for a one page memory.

FIG. 4 illustrates a layout for an interdigitated memory cell array. Memory cell array 40 has row drivers or decoders 42 and 44 on opposite sides of array 40. Also illustrated are column drivers or decoders 46 and 48 physically located on the top and bottom of array 40.

Figure 5:
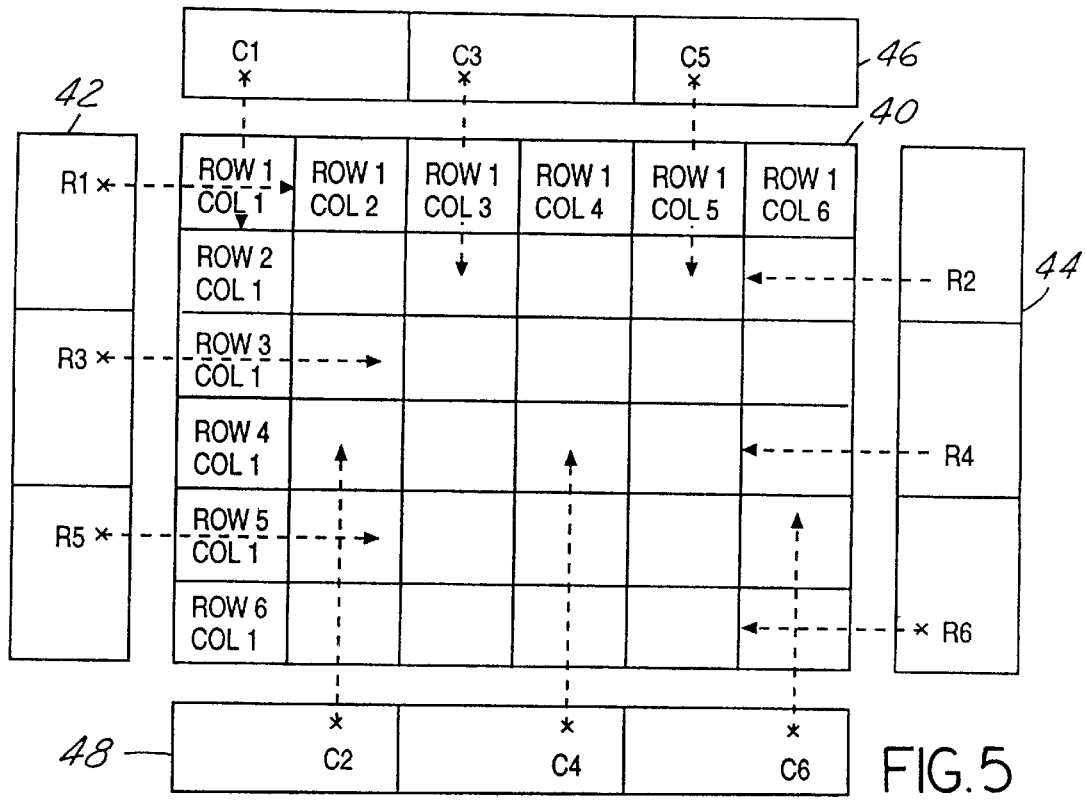
FIG. 5 is a layout diagram of a memory array illustrating column drivers and row drivers and associated memory cells using the method and apparatus of the present invention.
Figure 6:
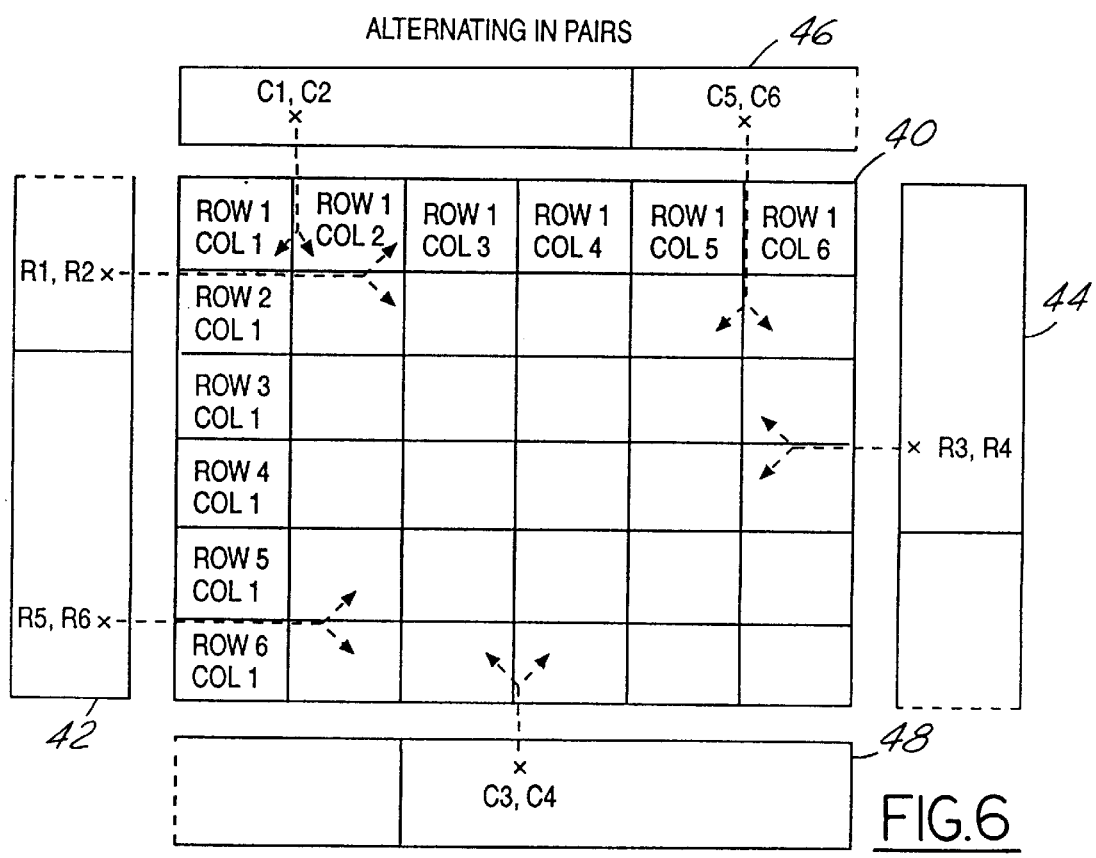
FIG. 6 is a layout diagram of a memory array similar to that shown in FIG. 5 but used for driving pairs of rows and columns.

In practicing the preferred embodiment of the present invention, decoupling the decoder cell pitch from the memory cell pitch is achieved for row decoders 42 and 44 by driving alternating rows from opposite sides as illustrated in FIG. 5. Odd numbered rows may be driven from one side by row driver 42 while even numbered rows are driven from the other side by row driver 44. Also, consecutive rows may be driven from one side, such as row 1 and 2 from the left side and rows 3 and 4 from the right side as illustrated in FIG. 6.

The method and apparatus of the embodiment illustrated in FIG. 5 allows the more efficient use of the chip surface and reduces operation time. The driver for row 1, R1 only has to drive across R3 and R5, to neither of which R1 has any electrical connections, to reach the memory array cells. Similarly, the driver for row 3, R3 only has to drive across R5, to which R3 has no electrical connections, to reach the memory array cells. R5, which previously had to drive across R6 to reach the memory array cells, now goes directly to the memory array cells. On the opposite side, the driver for row 2, R2 only has to drive across R4 and R6, to neither of which R2 has any electrical connections, to reach the memory array cells. Similarly, the driver for row 4, R4 only has to drive across R6, to which R4 has no electrical connections, to reach the memory array cells. As before, R6 goes directly to the memory array cells.

In the preferred embodiment of the present invention alternating columns are driven from both the top and bottom. Odd numbered columns are driven from the top by column driver 46 while even numbered rows are driven from the bottom by column driver 48. As with the row drivers, consecutive columns may be driven from the top, then the next group of consecutive columns drives from the bottom. Similar to the case for row drivers, the method and apparatus of the present invention allows the more efficient use of the chip surface and reduces operation time. The driver for column 1, C1 only has to drive across C3 and C5, to neither of which C1 has any electrical connections, to reach the memory array cells. Similarly, the driver for column 3, C3 only has to drive across C5, to which C3 has no electrical connections, to reach the memory array cells. C5, which previously had to drive across C6 to reach the memory array cells, now goes directly to the memory array cells. On the opposite side, the driver for column 2, C2 only has to drive across C4 and C6, to neither of which C2 has any electrical connections, to reach the memory array cells. Similarly, the driver for column 4, C4 only has to drive across C6, to which C4 has no electrical connections, to reach the memory array cells. As before, C6 goes directly to the memory array cells. Also, both row and column drivers may be broken into groups such that the first group may be driven from one side or the top and the second group may be driven from the other side or the bottom.

FIG. 5 has been greatly simplified for the purposes of illustration. Only six row drivers are illustrated and only six column drivers are illustrated. Also, only a total of thirty-six memory cells are illustrated in the array, also for simplicity. It can be appreciated that in practicing the present invention, each driver has to drive across either half or one less than half the number of other drivers to which the driver has no electrical connection than in the prior art. This technique may be used either for the row driver alone or the column driver alone or for both the row and the column drivers. Either one or the other may use the technique depending usually on the size and aspect ratio of the memory cell.

FIG. 6 is a simple illustration of the same technique used for driving pairs of rows and columns in a similar way to FIG. 5.

The architecture of the present invention is particularly useful for memory arrays where the cells are very small. For example, the architecture of the present invention is particularly useful in the manufacture of EPROMs. In addition, the new architecture of the present invention could be more area efficient than conventional schemes as memory cell size reduces.

The present invention has provided a method and apparatus to eliminate the problem of requiring sizing of the row and column decoders according to the pitch of the cells in the memory array. The method and apparatus of the present invention eliminates this problem by decoupling the decoder cell pitch from the memory cell pitch without causing the chip area to increase dramatically. Decoupling the row decoder or driver cell pitch in the present invention is accomplished by driving the array from both sides. This is achieved by driving alternating rows from opposite sides for the row decoders. Even numbered rows are driven from one side and odd numbered rows are driven from the other side. Decoupling the column decoders or drivers in the present invention is accomplished by driving alternating columns from both the top and bottom. For example, odd numbered columns are driven from the top while even numbered columns are driven from the bottom.

While there has been illustrated and described a particular embodiment of the present invention, it will be appreciated that numerous changes and modifications will occur to those skilled in the art, and it is intended in the appended claims to cover all those changes and modifications which fall within the true spirit and scope of the present invention.

In particular, it could be used on single page memory arrays like FIG. 1 or to multiple page arrays like FIG. 2 or to architectures where the memory array has a page structure as illustrated but also has local row or column driver cells embedded within the array so as to subdivide the page into subparts. The subparts thus have their own local row and/or column dividers

I claim:

1. A method of accessing rows in a memory array, said memory array having a memory cell pitch and said rows being connected to a row decoder having a row decoder cell pitch, said method comprising the steps of:

decoupling the row decoder cell pitch from the memory cell pitch; and driving a predetermined number of consecutive rows from opposite sides for row decoders.

2. The method according to claim 1 wherein said step of driving consecutive rows includes the steps of:

driving first and second consecutive rows from one side; and driving third and fourth consecutive rows from the other side.

3. The method according to claim 2 wherein said method further includes the step of:

driving fifth and sixth alternating rows from opposite sides for row decoders.

4. The method of claim 2, further comprising the step of driving fifth and sixth consecutive rows from said one side.

5. The method according to claim 1 further comprising the step of:

decoupling a column decoder cell pitch from the memory cell pitch.

6. The method according to claim 5 wherein said method further includes the step of:

driving the memory array from both top and bottom.

7. The method according to claim 6 wherein said step of driving the memory array includes the step of:

driving alternating columns from alternating top and bottom positions for column decoders.

8. The method according to claim 7 wherein said step of driving alternating columns includes the step of:

driving even numbered columns from one of said top and said bottom; and driving odd numbered columns from the other of said top and said bottom.

9. The method of claim 6, wherein said step of driving the memory array comprises driving a predetermined number of consecutive columns from the top of said memory array.

10. The method of claim 9, further comprising the step of driving a predetermined number of consecutive columns from the bottom of said memory array.

11. The method of claim 9, said memory array further comprising rows connected to a row decoder, said row decoder having a row decoder cell pitch, said method further comprising the step of decoupling said row decoder cell pitch from said memory cell pitch.

12. The method of claim 11, further comprising the step of driving alternating rows from opposite sides for row decoders.

13. The method of claim 11, further comprising the steps of:

driving a predetermined number of consecutive rows from one side of said memory array; and driving a predetermined number of consecutive rows from the other side of said memory array.

14. A method of accessing columns in a memory array having a memory cell pitch, a top and a bottom, said columns being connected to a column decoder having a column decoder cell pitch, said method comprising the steps of:

decoupling the column decoder cell pitch from the memory cell pitch; and driving a predetermined number of consecutive columns from the top of the memory array, and separately, from the bottom of the memory array for column decoders.

15. The method of claim 14, wherein said step of driving a predetermined number of consecutive columns comprises:

driving at least first and second consecutive columns from the top of said memory array; and driving at least third and fourth consecutive columns from the bottom of said memory array.

16. The method of claim 15, further comprising the step of driving at least fifth and sixth consecutive columns from said top of said memory array.

17. The method of claim 15, further comprising the step of driving at last fifth and sixth alternating columns from alternating top and bottom positions for column decoders.

18. An apparatus comprising:

a memory array having a memory cell pitch; and at least two row decoders located on opposite sides of said memory array, said row decoders having a row decoder cell pitch different from and decoupled from the memory cell pitch; and means for driving at least two consecutive rows from each of said opposite sides of said memory array.

19. The apparatus according to claim 18 wherein said means for driving includes:

side driver means for driving the memory array from both sides.

20. The apparatus according to claim 19 wherein said side driver means further includes:

means for driving even numbered rows from one side; and means for driving odd numbered rows from the other side.

21. The apparatus according to claim 20 wherein said means for driving rows includes:

first driver means for driving predetermined rows from one side; and second driver means for driving other rows from the other side.

22. The apparatus according to claim 18 wherein said means for driving includes:

first driver means for driving a predetermined number of consecutive rows from one side; and second driver means for driving a predetermined number of consecutive rows from the other side.

23. The apparatus according to claim 18 wherein said means for decoupling includes:

at least two column decoupling decoders having the column decoder cell pitch different from and decoupled from the memory cell pitch.

24. The apparatus according to claim 23 wherein said memory array includes a plurality of columns, and said apparatus further comprises:

means for driving the columns from both top and bottom of the memory array.

25. The apparatus according to claim 23 wherein said means for driving the columns includes:

alternating drive means for driving alternating columns from alternating top and bottom positions of the memory array.

26. The apparatus according to claim 25 wherein said alternating drive means includes:

means for driving even numbered columns from one of said top and said bottom; and means for driving odd numbered columns from the other of said top and said bottom.

27. An apparatus comprising:

a memory array having a plurality of columns, a memory cell pitch, a top and a bottom;

at least one column decoder located at the top of said memory array and at least one column decoder located at the bottom of said memory array, said column decoders having a column decoder cell pitch; different from and decoupled from said memory cell pitch; and means for alternately driving a predetermined number of consecutive columns from the top of said memory array, and separately, from the bottom of said memory array.

* * * * *